US009759602B2

(12) United States Patent
Williams

(10) Patent No.: US 9,759,602 B2
(45) Date of Patent: Sep. 12, 2017

(54) AVALANCHE PHOTODIODE RECEIVER

(71) Applicant: Voxtel, inc., Beaverton, OR (US)

(72) Inventor: George Williams, Portland, OR (US)

(73) Assignee: Voxtel, Inc, Beaverton, OR (US)

( * ) Notice: Subject to any disclaimer, the term of this patent is extended or adjusted under 35 U.S.C. 154(b) by 0 days.

(21) Appl. No.: 15/379,435

(22) Filed: Dec. 14, 2016

(65) Prior Publication Data

US 2017/0097263 A1    Apr. 6, 2017

Related U.S. Application Data

(60) Continuation-in-part of application No. 15/000,309, filed on Jan. 19, 2016, now Pat. No. 9,553,216, which is a division of application No. 13/779,448, filed on Feb. 27, 2013, now Pat. No. 9,269,845.

(60) Provisional application No. 61/603,760, filed on Feb. 27, 2012, provisional application No. 61/603,825, filed on Feb. 27, 2012, provisional application No. 61/645,159, filed on May 10, 2012.

(51) Int. Cl.
*H01L 31/00* (2006.01)
*G01J 1/44* (2006.01)
*H01L 31/107* (2006.01)

(52) U.S. Cl.
CPC ......... *G01J 1/44* (2013.01); *G01J 2001/4466* (2013.01); *H01L 31/107* (2013.01)

(58) Field of Classification Search
CPC ........................... H01L 31/107; H01L 31/1075
USPC .................. 250/214 R, 214 VT, 207, 214 A; 257/184, 186, 199
See application file for complete search history.

(56) References Cited

U.S. PATENT DOCUMENTS 9,354,113 B1 * 5/2016 Hayat ................... H04B 10/693
9,559,617 B2 * 1/2017 Landa ..................... H01J 45/00

* cited by examiner

*Primary Examiner* — Kevin Pyo

(57) ABSTRACT

A method of detecting an optical signal, comprising the steps of: providing an avalanche photodiode (APD) comprising a multiplication region capable of amplifying an electric current, said multiplication region, in operation, having a first ionization rate for electrons and a second ionization rate for holes, wherein said first ionization rate is different in magnitude from said second ionization rate, and exposure to the optical signal causes an impulse response; exposing the APD to a modulating optical signal; providing an external circuit that induces an APD bias to the multiplication region; providing an external circuit for amplifying and processing an electric signal from the avalanche photodiode; and modulating the APD bias in a manner that is correlated with the optical signal.

21 Claims, 6 Drawing Sheets

AVALANCHE PHOTODIODE RECEIVER

CROSS REFERENCE TO RELATED APPLICATIONS

This application is a continuation-in-part of U.S. patent application Ser. No. 15/000,309 filed on Dec. 19, 2016 and U.S. patent application Ser. No. 13/779,448 filed on Feb. 27, 2013, both of which claim benefit of U.S. provisional applications 61/603,760, 61/603,825, 61/645,159 all of which are hereby incorporated by reference in their entirety.

BACKGROUND

An avalanche photodiode that selectively amplifies the response of electrons while suppressing the response of holes is described in U.S. Pat. No. 7,432,537, the disclosure of which is hereby incorporated by reference in its entirety.

Photoreceivers often incorporate an avalanche photodiode (APD) structure. A photodiode is a semiconductor device that transforms light into electrical current. The electrical current carried by charge carriers generated by the absorption of light inside the photodiode is called "photocurrent," and the ratio of photocurrent in Amperes to the incident optical power in Watts is called the photodiode's "responsivity." An APD is a photodiode with increased responsivity due to internal amplification of the photocurrent by an impact-ionization process. APDs are used for the detection of weak optical signals in situations where their high responsivity boosts the photocurrent signal relative to the downstream circuit noise sources in the detection system.

An APD functions similarly to its older vacuum-tube equivalent, the photomultiplier tube. Light strikes an absorption region and promotes electrons over the relatively narrow band gap of a semiconductor material, creating electron-hole pairs. A photon-stimulated electron is thereby injected into the multiplication region, and is accelerated by a biasing electric field. While many such electrons suffer phonon collisions with the crystal lattice that limit their drift velocity, some accumulate enough energy to boost a plurality of electrons over the ionization threshold level in the multiplication region, creating additional electron-hole pairs to contribute to the photocurrent. This process, known as impact-ionization, is repeated several times, resulting in photocurrent growth as the new electrons and holes accumulate energy and excite additional pairs. However, this benefit comes at the expense of an increase in signal noise due to the fluctuations in the gain, which leads to uncertainty in the amplitude and energy of the incoming signal.

The noise of the multiplication process is determined by the variations in the magnitude and the times of the ionization processes in the multiplication region. The noise of the avalanche process is determined by the variance of the gain distribution about the mean gain level. A narrow distribution of gain about the mean is generally a result of gain attributed to single carrier ionization, whereas a wider variance signifies a more random gain distribution, and is generally a result of two carrier ionization processes.

At the onset of the avalanche, if the carrier type that is injected from the absorption region has an equal or greater than ionization rate as the non-injected carrier type, the greatest contribution to the accumulated gain results from ionization of the injected carrier type, because carriers of that type travel the entire length of the multiplication region. For convenience, we refer to the time that the avalanche initiating carrier transits the entire length of the multiplication region as the primary-carrier transit time. The motion of the carriers within the APD induces current in the circuits external to the APD.

The fastest detectable signal also comes from the injected carrier, as during the initial primary-carrier transit time the generations of progeny carriers traveling with the initiating photoelectron ionize and create progressively increasing numbers of electron-hole pairs as they get closer to the exit point.

During the primary-carrier transit time, the greatest number of non-injected carriers are created at the farthest point from which they may exit, and they then travel the full length of the multiplication stage, creating successive generations of progeny, before entering the absorption region, where they continue to drift before exiting the junction. We can refer to the time that the non-avalanche-initiating carrier transits the entire length of the multiplication region as the secondary-carrier transit time. Ignoring the time of carrier drift through the absorption region, the maximum temporal duration of the signal current contribution due to the ionization of the initiating photoelectron is the primary-carrier transit time plus the secondary-carrier transit time.

The current induced in an external circuit is proportional to the length of the junction, the number of carriers in the junction and the carrier velocities. Assuming no subsequent occurrences of ionization, the magnitude of the current induced by an electron-hole pair created by an ionization event is proportional to the velocities of each carrier and is inversely proportional to the width of the junction. The duration of the current contribution by the electron created by an ionization event is inversely proportional to the electron's velocity and directly proportional to the distance the electron travels from the point of its creation to the cathode. The duration of the current contribution by the hole created by an ionization event is inversely proportional to the hole's velocity and directly proportional to the distance the hole travels from the point of its creation to the anode.

Generally, for a given APD structure with an avalanche multiplication consisting of only single carrier ionization, at higher bias, there is an increase in signal amplitude, but the duration of the impulse response does not substantially increase. The increased probability of ionization of the initiating carrier type that results from the stronger electric field increases the number of ionization chain branches only during the primary-carrier transit time. At that time, the primary carriers of the electron-hole pairs leave the multiplication region and recombine at the contact; the carriers of the other type drift back toward the absorption region, and continue to contribute to the signal current until they have traversed both the multiplication region and the absorption region.

Since enhancement of one carrier's ionization and suppression of the other may not be complete in an APD, assuming a higher ionization rate for the avalanche initiating carrier over that of the other carrier, there may be an initial signal peak due to the creation of electron-hole pairs by ionization of the injected carrier and its same type progeny near the completion of the initial primary-carrier transit time, followed by a delayed and noisier tail created by the branches of the ionization chains triggered by ionization of carriers of the non-injected type.

For APDs with two-carrier ionization, the duration of the impulse response increases at higher bias. The higher ionization rates caused by the stronger electric field cause both an increased number of branches in the ionization chain and extend the duration of the ionization branches to periods longer than a single carrier transit time.

SUMMARY

In accordance with a first aspect of the subject matter disclosed herein, there is provided a method of detecting A method of detecting an optical signal, comprising the steps of: providing an avalanche photodiode (APD) comprising a multiplication region capable of amplifying an electric current, said multiplication region, in operation, having a first ionization rate for electrons and a second ionization rate for holes, wherein said first ionization rate is different in magnitude from said second ionization rate, and exposure to the optical signal causes an impulse response; exposing the APD to a modulating optical signal; providing an external circuit that induces an APD bias to the multiplication region; providing an external circuit for amplifying and processing an electric signal from the avalanche photodiode; and modulating the APD bias in a manner that is correlated with the optical signal.

DETAILED DESCRIPTION OF PREFERRED EMBODIMENTS

Figure 1:
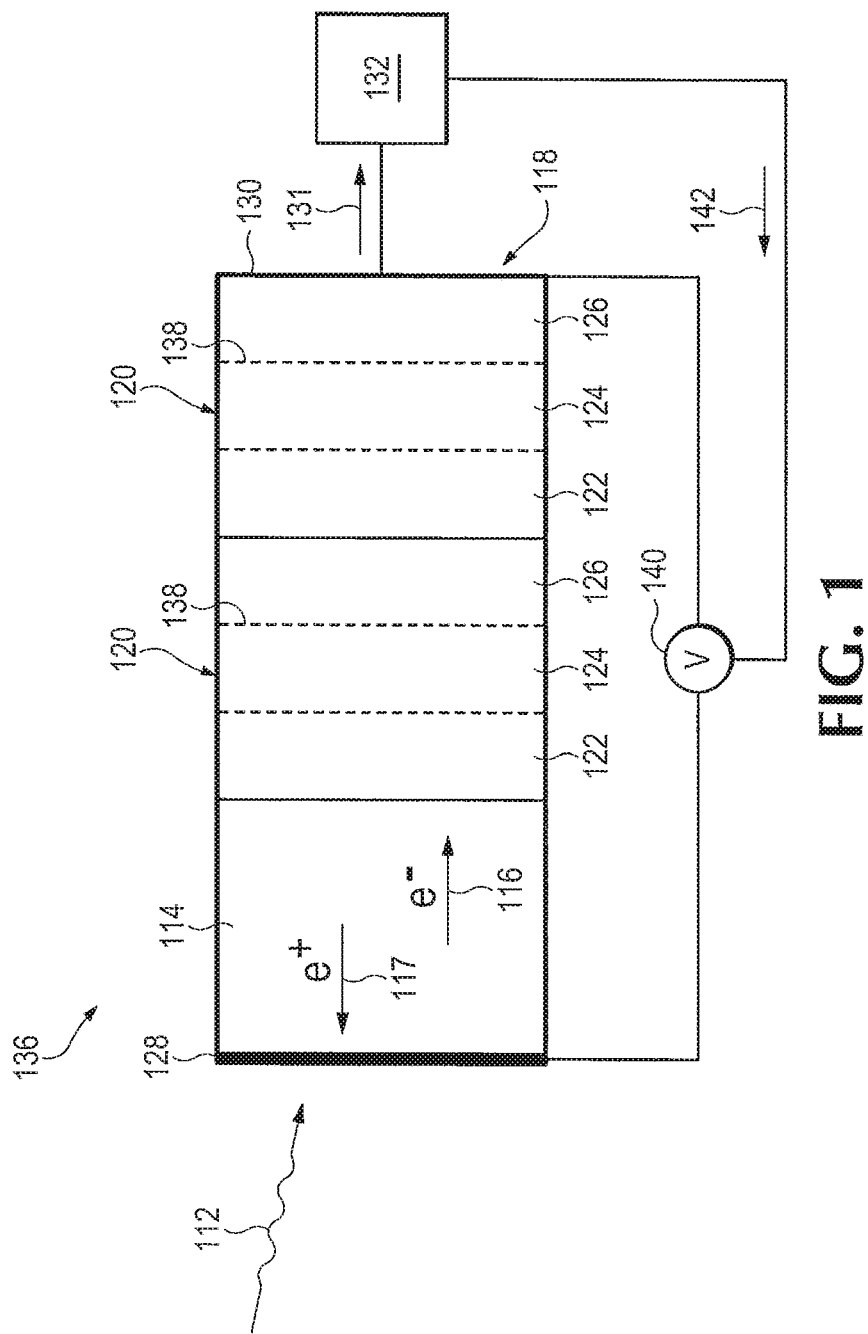
FIG. 1 shows a schematic representation of an APD and processing circuit.

An APD photoreceiver comprises an APD that preferentially causes ionization of electrons over ionization of holes. The current contributions from ionization of electrons and from ionization of holes therefore dominate the output of the APD at different times in a single response. An APD biasing circuit can be used to bias the APD on for a fixed period of time in which electron-driven ionization dominates the output current, while lowering or eliminating bias for another period of time such that the contribution from hole-driven ionization is suppressed.

Amplification, filtering, and sampling circuits can be used to amplify the output signal and perform pulse detection or pulse integration for -a fixed portion of the response, during which the electron driven ionization dominates the output current. Alternatively, the amplification and sampling circuitry can be used to amplify the output signal and perform pulse detection or pulse integration, while measuring the mean or other statistical moments of the avalanche process. Measurement of signal statistics is well known in the art; a non-limiting example would be the use of a boxcar averager to deduce a mean in a repetitive signal. When the appropriate time passes or a fixed criterion such as a particular mean or other statistical moment is achieved, the circuit can reduce or eliminate the reverse bias, suppressing the noisy tail. Alternatively, the circuit can stop integrating, reset itself, or cease involving decision making circuitry for another period of time such that the contribution to noise from the ionization feedback initiated by holes is gated. For the purposes of this application, "suppression" refers to the change of the magnitude of reverse bias, causing a reduction in gain within the APD itself, while gating refers to a reduction in amplification in processing circuits downstream from the APD itself.

In this way noise can be reduced by sensing the avalanche process driven by electrons, but suppressing or gating at least some of the noise resulting from the feedback ionization by holes.

Most APDs designed to detect light of wavelength longer than 1 tm segregate light-absorption and current-multiplication functions into physically separate regions of the epitaxial structure. The separate absorption, charge, and multiplication (SACM) design is employed because the strong electric field required to drive impact-ionization can also drive band-to-band tunneling in the narrow-bandgap semiconductor alloys required to absorb infrared light. When occupied valence band states are in sufficiently close proximity to vacant conduction band states of the same energy, dark current is generated when electrons quantum tunnel through the potential energy barrier separating the two bands. Strong electric fields promote tunnel leakage by setting up the potential energy gradient responsible for vacant conduction band states lying at the same potential energy as occupied valence band states a short distance away; the more narrow the bandgap and the stronger the electric field, the higher the tunnel probability. The SACM design addresses this problem by confining the strong electric field to a wide-bandgap multiplication region for which the band-to-band tunnel probability is low under normal operating conditions, while optical absorption is confined to an adjacent narrow-bandgap region in which the electric field is relatively weak; an intervening space charge layer is responsible for the transition between regions of strong and weak electric field inside the APD junction.

The impulse response duration (called the "avalanche buildup time") of an APD is the time it takes for the initial avalanche of carriers in its multiplication region to complete and for the last of the subsequent generations of ionizing progeny of the avalanche-initiating carrier to clear the junction. The duration of the impulse response is proportional to the length of the junction, the magnitude and ratio of the carrier ionization rates, and the average velocity of each of the carriers.

We define an excess noise factor, F(M) for a linear mode APD as $F(M)=<M^2>/<M>^2$, where the excess noise is defined by the mean and the second moment of the gain M. For APDs that are well described by McIntyre's theory, the form of the F(M) function ensures that APDs in which impact ionization is dominated by a single carrier type will have lower multiplication noise. Any technique that acts to localize impact ionization and eliminate the variance of the extent of some of the structure's possible ionization chains will also reduce its excess noise. The practice of building heterostructure multiplication regions from materials with dissimilar ionization thresholds falls into this category. A typical structure of this variety has a wide-band gap region on the p-side of the multiplication layer and a narrower-band gap region on the n-side; electrons that pick up energy in the wide-gap material do not trigger ionizations until they hit the lower-threshold narrow-gap material, whereas the holes generated by those collisions in the narrow-gap material fail to gain sufficient energy to ionize when they drift through the wide-gap region.

Similarly, if the APD is subject to reverse bias for a period shorter than its avalanche buildup time, the noise of the avalanche process can be reduced by terminating the longer ionization chains, such that while the overall mean gain of the avalanche gain is reduced, the variance of the avalanche process is reduced by the truncation of the longer ionization chains so that signal to noise is increased.

Generally, the instantaneous current induced by the avalanche process can be obtained by adding up the current contributions from all the carriers that are traveling in the junction at any one time. Since impact ionization is a random process, the APD's impulse-response function is a stochastic process with a random duration (viz., impulse response duration) and a stochastic area representing the multiplication factor, or low frequency gain. The gain and response duration are statistically correlated; both the mean and the variance (fluctuation) of the APD's photocurrent output will vary as a function of the time-dependent ionization process.

We define an instantaneous excess noise factor, F(t), for the impulse response function, where $F(t)=<m_t^2>/<m_t>^2$, t is the instant in time after the initiation of the avalanche process, $<m_t>$ is the mean gain of the carriers in the junction at each instance of time, and $>m_t^2>$ is the statistical second moment of the carriers in the junction at each instance in time.

We also define a cumulative instantaneous excess noise factor, $F(\tau)$, for the impulse response function, where $F(\tau, m_\tau)=<m_\tau^2><m_\tau>^2$, where $m_\tau$ is the gain integrated up to a point of time, r, in the avalanche buildup time so that $m_\tau \int_{t=0}^{\tau} g_\tau dt$, where $g_\tau$ is the incremental gain at each point of time of the avalanche buildup. In the limit, as $\tau \to \infty$, $g_\tau \to M$, and $F(\tau, m\tau) \to F(M)$.

Given an APD which upon receiving a short optical pulse generates an amplified signal with portions dominated by the ionization of one type of charge carrier and another portion dominated by ionization of the other charge carrier type or by ionization of both charge carriers, it is possible to optimize the bias across the terminals of the APD or to manipulate the external amplification or sampling circuit so as to enhance the low noise portion of the impulse response that is dominated by single carrier ionization and to suppress or gate the noisy portion of the signal induced by two carrier ionization processes.

Figure 2:
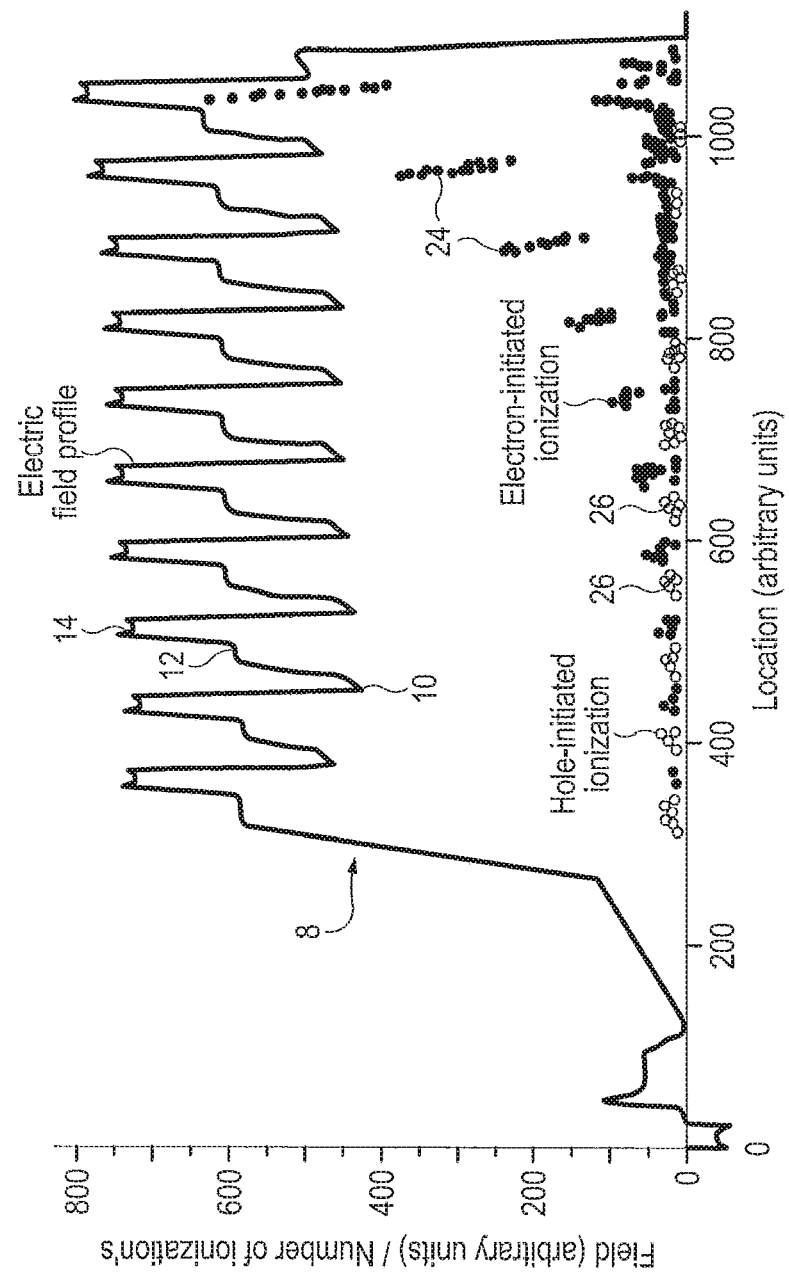
FIG. 2 is the simulated spatial distribution of electron-and hole-initiated impact ionization events overlaid on the electric field profile of the cascaded, asymmetric gain stages of the multiplication region of a multi-gain-stage heterostructured APD.

A detailed discussion of linear mode SACM APD's with differing ionization rates for electrons and holes is contained in U.S. Pat. No. 7,432,537, the disclosure of which is hereby incorporated by reference in its entirety. FIG. 1 illustrates an APD 136 having an absorption region 114 and a multiplication region 118 located between an anode 128 and a cathode 130 each connected to a biasing circuit 140. The multiplication region 118 preferably comprises multiple heterostructured gain stages 120. The biasing circuit 140 provides an electric potential between anode 128 and cathode 130, which is the source of an electric field within the multiplication region 118. This field constitutes a "reverse bias," which means positive voltage is applied to the cathode and negative voltage to the anode, so that current does not flow freely. The electric field can be varied by adjusting the electric potential provided by the biasing circuit 140. FIG. 2 shows the electric field distribution 8 within a multi-stage multiplication region. Each gain stage 120 comprises a drift layer 122 oriented towards the anode 128, an acceleration layer 124, and an ionization layer 126 oriented towards the cathode 130.

When a photon 112 enters the absorption region 114 of APD 136, it generates an electron 116 which drifts into the multiplication region 118. The electron 116 enters the drift layer 122 of the first gain stage 120. The drift layer 122 has the lowest electric field 10 (FIG. 2) and an electron 116 can lose excess energy in the drift layer 122 by collisions. In a preferred embodiment, the drift layer 122 is an undoped, or "intrinsic" layer. Despite this energy loss, the field 10 allows the electron to continueto drift toward the cathode 130 and enter the acceleration layer 124, where the intermediate electric field 12 causes the electron to accelerate and gain energy. In the case of the embodiment described with reference to FIGS. 1 and 2, in which electrons 116 pass from the absorption region 114 to the multiplication region 120, the acceleration layer 124 comprises a p-type dopant. Finally, in the ionization layer 126, which comprises an n-type dopant, the highest electric field 14 in the multiplication region 118 is combined with a material with a lower band gap than is present in the drift layer 122 or acceleration layer 124.

Referring to FIG. 1, the impact-ionization process is driven by a strong local electric field inside the depletion region of the diode junction 138 between the acceleration layer 124 and the ionization layer 126. The high electric field imparts momentum to carriers drifting in the junction 138, where a portion of the carrier population accumulates enough kinetic energy between scattering events to excite creation of new electron-hole pairs. The resulting increase in the number of carriers in the junction 138 is responsible for the current gain of the APD.

In the case of the embodiment described with respect to FIGS. 1 and 2, the structure of the gain stage 120 is favorable to impact ionization by electrons, which pushes other electrons from the valence band into the conduction band while leaving a hole behind, and to the acceleration of these progeny electrons towards the cathode 130. The progeny electrons then pass into the drift layer 122 of the next gain stage 120, and spend proportionally less time above the ionizing threshold level, before repeating the cycle. In this way, the injected electron 116 is multiplied into a detectible current output 131 induced in the processing circuit 132.

Holes face a very different environment. A hole 117 created by a photon 112 does not enter the multiplication region 118 from the absorption region 114. A hole created by impact ionization in the ionization layer 126 will tend to accelerate towards the anode 128. However, before sufficient energy is gathered to cause further ionization, it will pass into the acceleration layer 124. Here, the intermediate electric field 12, lower than the highest electric field 14, will slow the rate of energy gain (although the hole will continue to accelerate), and the larger band gap will lower the probability of ionization. When the hole then passes into the drift layer 122, it will, like an electron, lose energy due to collisions, although it will continue to drift. When the hole enters the next ionization layer 126, it will have low kinetic energy and be unable to gain sufficient kinetic energy to cause ionization before drifting out again. In this fashion, the portion of the APD's responsivity related to electron-initiated ionization events is enhanced while that of holes is suppressed. This is shown in FIG. 2, where the number of electron-initiated ionization events 24 grows in each gain stage 120 as the initial photoelectron 116 passes through the multiplication region 118 and creates more progeny electron-hole pairs, but the probability of hole-initiated ionization 26 from the electron-hole pairs is minimal.

When the APD is designed such that holes instead of electrons drift into the multiplication region 118 from the absorption region 114, reversing the electric field and orientation of the layers in each gain stage 120 can serve to promote ionization of holes and suppress that of electrons. In this case, the acceleration layer 124 comprisesan n-type dopant, and the ionization layer 126 comprises a p-type dopant.

Figure 3:
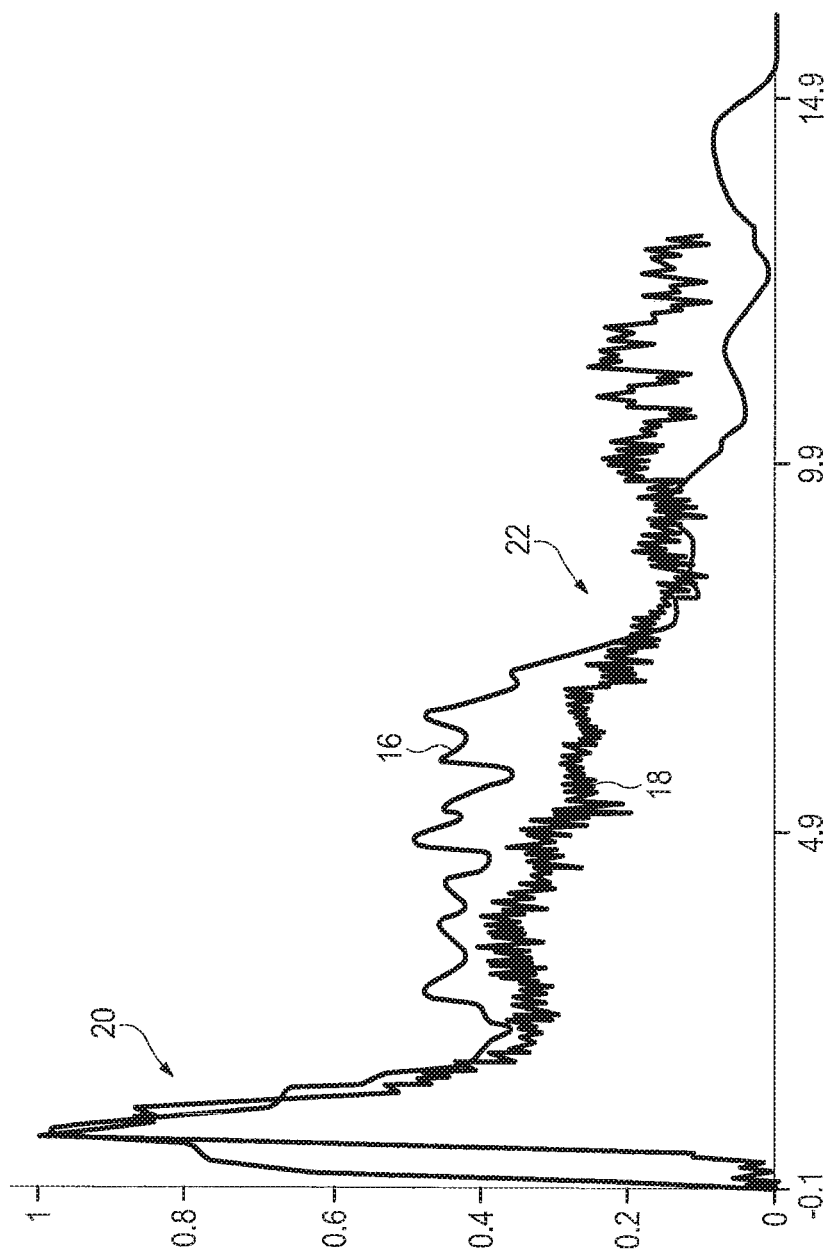
FIG. 3 shows the normalized measured and simulated impulse response functions for the 10-stage heterostructured APD whose multiplication region's field profile is shown in FIG. 2, calculated for a gain M=687 (16) and measured for a gain M=800 (18). The time scale is in nanoseconds.

The waveform of the current output 131 generated by an APD like that described above in response to an incident photon tends to resemble FIG. 3, which shows both a simulated output 16 and an experimentally measured output 18. There is a sharp, low-noise initial pulse 20, caused by the electron-hole pairs created by the initial photoelectron 116 and its electron-initiated ionization progeny 24, and a protracted, noisier tail 22 caused by ionization chains initiated by feedback hole-driven ionization events 26. To suppress the noise of the long tail 22 and permit the APD 136 to return to a state of readiness more rapidly, it is desirable to reduce or eliminate the electric field 8 within the multiplication region 118 after the initial pulse 20 by appropriately controlling the biasing circuit 140. The low-noise electron-driven initial pulse 20 is passed, while the high-noise hole driven tail 22 is suppressed.

Different suppression strategies may be employed depending on the nature of the signal being detected. For a single, narrow signal pulse the suppression is simple; the electric field 8 can be reduced or eliminated after sufficient gain is achieved so that the signal-to-noise is optimized by suppressing the later portions 22 of the impulse response and their associated noise. Biasing circuit 140 may respond to a signal 142 from processing circuit 132 to modulate, reduce, or eliminate bias at that time. For a regular periodic signal 112, synchronous electric field variation matched to the signal's period can both suppress noise and increase bandwidth. Biasing circuit 140 may generate this periodic bias internally or an external signal may be supplied. Without the noisy tail 22, pulses can be packed closer together to increase the amount of data receivable in a given time period. On the other hand, less orderly signals can have noise suppressed by using the processing circuits 132 to detect the leading edge 20 of the impulse response and cause the bias control circuit 140 to reduce the electric field 8 after a predetermined interval chosen to optimize the signal to noise ratio. Also, the less orderly signals can have noise suppressed in the processing circuit 132 by integrating the impulse response and using the bias control circuit 140 to modulate the electric field 8 after a predetermined mean or other statistical moment has been reached.

The current output 131 may also be selectively amplified, filtered, or integrated by processing circuit 132, with or without changes in the electric field 8, to eliminate the noisy tail 22 of the impulse response.

Figure 4:
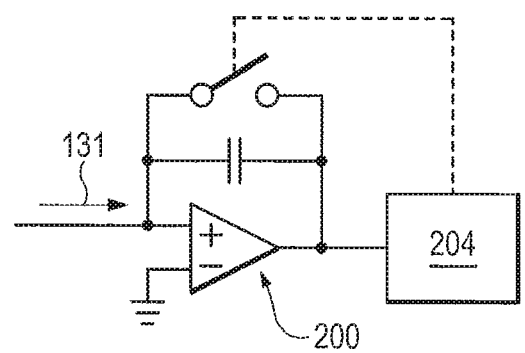
FIG. 4 shows an embodiment of a processing circuit comprising an integrating circuit in the form of a capacitive transimpedance amplifier and a decision circuit.

When the processing circuit 132 includes an integrate-and-dump circuit, consisting of a capacitive transimpedance amplifier 200 and a decision circuit 204 such as shown in FIG. 4, the integration time can be selected to integrate the current output 131 up to the point that the signal to noise ratio is maximized and to not integrate the more noisy later portions 22.

Figure 5:
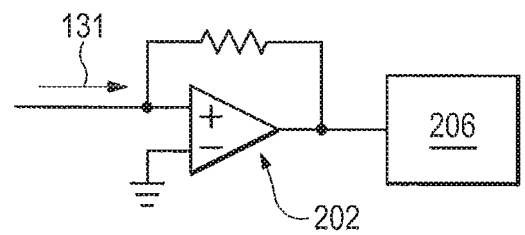
FIG. 5 shows an embodiment of a processing circuit comprising a resistive transimpedance amplifier and decision circuit.

The processing circuit 132 alternatively may include a resistive transimpedance amplifier 202, which processes the current output 131 as shown in FIG. 5. A decision circuit 206 at the output of the resistive transimpedance amplifier202 may include a threshold comparator 208 to detect the leading edge 20 of the current output 131 and not the noisy tail 22. The decision circuit 206 may also include a filter to process the amplified signal. A bandpass filter may be used to allow for the higher frequency components that comprise the initial times 20 of the impulse response to be amplified, rejecting the lower frequency portions of the impulse response, which comprise mostly the longer times of the long tail 22. Alternatively, a high pass filter can be used so to separate the high frequency components from the low frequency components best detect the lead portion 20 of the impulse response.

Figure 6:
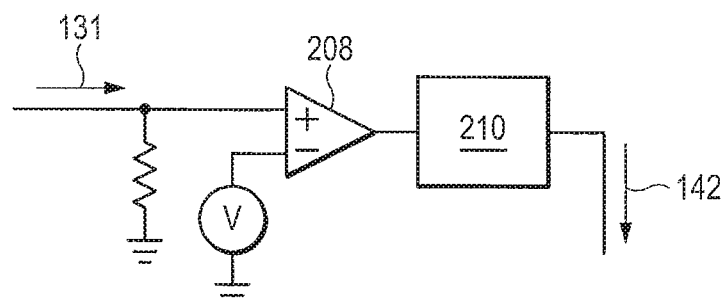
FIG. 6 shows a decision circuit in the form of a threshold comparator and a delay circuit.

The decision circuits 204, 206 may include a threshold comparator 208 as depicted in FIG. 6 that detects an incoming pulse, and a delay circuit 210 that permits integration to continue for a predetermined interval. Alternatively, the decision circuit 204, 206 might permit current output 131 to be integrated only for the time that the signal remains above the comparator threshold. Also, the decision circuit 204, 206 may include a peak detector that detects the peak of the incoming pulse, and stops the integration of the current output 131 after a predetermined time.

The decision circuit 204, 206 might also signal biasing circuit 140 to lower or eliminate the electric field 8 to suppress the generation of the noisy tail 22.

In another method in accord with the present disclosure a modulated bias is used with the APD when detecting a modulated optical signal. One such method comprises the steps of: providing an avalanche photodiode (APD) comprising a multiplication region capable of amplifying an electric current, said multiplication region, in operation, having a first ionization rate for electrons and a second ionization rate for holes, wherein said first ionization rate is different in magnitude from said second ionization rate, and exposure to the optical signal causes an impulse response; exposing the APD to a modulating optical signal; providing an external circuit that induces an APD bias to the multiplication region; providing an external circuit for amplifying and processing an electric signal from the avalanche photodiode; and modulating the APD bias in a manner that is correlated with the optical signal.

Figure 7:
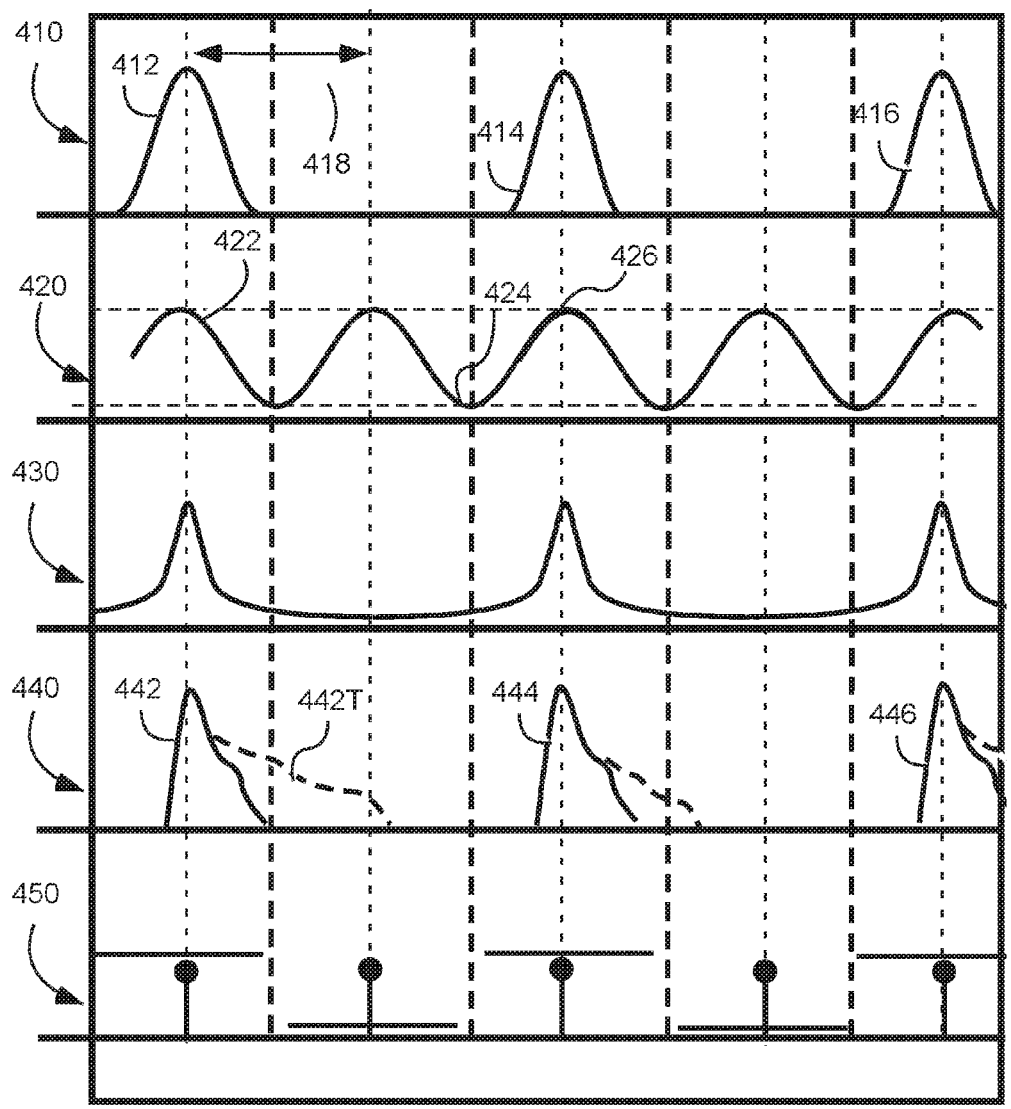
FIG. 7 shows temporal events of a modulated bias relative to an optical signal illustrating details of another method of the present disclosure.

Referring to FIG. 7, a graph 300 illustrates a nonlimiting examples of an optical signal 410, an APD bias profile 420, a gain profile 430, and an electric signal profile 440 using the aforementioned method. In this operational example, the optical signal is fixed and the APD bias are fixed and matched.

Optical signal 410 has a first optical pulse 412, a second optical pulse 414, and a third optical pulse 416 detected by the APD. Here, the optical pulses come from a source that can deliver frequency 418, double the frequency of the pulses shown. The external circuit applies voltage to the APD multiplication region represented as APD bias 420. Here, APD bias 420 has a sinusoidal shape with phase peaks corresponding to peak of the optical pulses. APD bias 420 is modulated with the same frequency of the optical source and phase matched so the voltage peaks align with the optical pulse peaks. The APD bias 420 is modulated with a minimum voltage 424 that is at or above the APD breakthrough voltage. The APD bias 420 has a peak voltage 426 that is generally kept below the breakdown voltage, but can be driven temporarily above the breakdown voltage. The bias profile and gain profile are explained in more detail further hereinbelow.

The modulated bias, and thus modulated gain, reduce noise and increase the signal-to-noise ratio by reducing gain of avalanche near the tail end of the induced impulse response from the optical signal. Electric signal profile 440 has three impulse response events 442, 444, and 446 which correspond to the three optical pulses. As described above, the impulse response of the APD has a probability of a noisy long tail that is preferably rejected. Illustrated as a dashed line, impulse response event 442 has a long tail 442N if biased with a fixed voltage and a fixed gain. Here, the bias modulation reduces gain and the long tail is suppressed. This suppression aids in signal-to-noise ratio and allows faster operation speeds in a variety of applications. One such application, telecommunications as illustrated by sampling signal 350 provides a nonlimiting example of such advantages.

Sampling circuit 350 samples the electric signal at a frequency match with the optical source to detect and register a binary signal. A noisy tail 442T, if present, would otherwise trigger if not for the gain modulation. The methods of the present disclosure can be implemented for optical signals at rates greater than 1 GHz. The methods are suitable for optical signal that implement amplitude-shift key (ASK) modulation and On-off key (OOK) modulation. APD bias modulation can be changed to reduce bit error rates in telecom communications.

Figure 8:
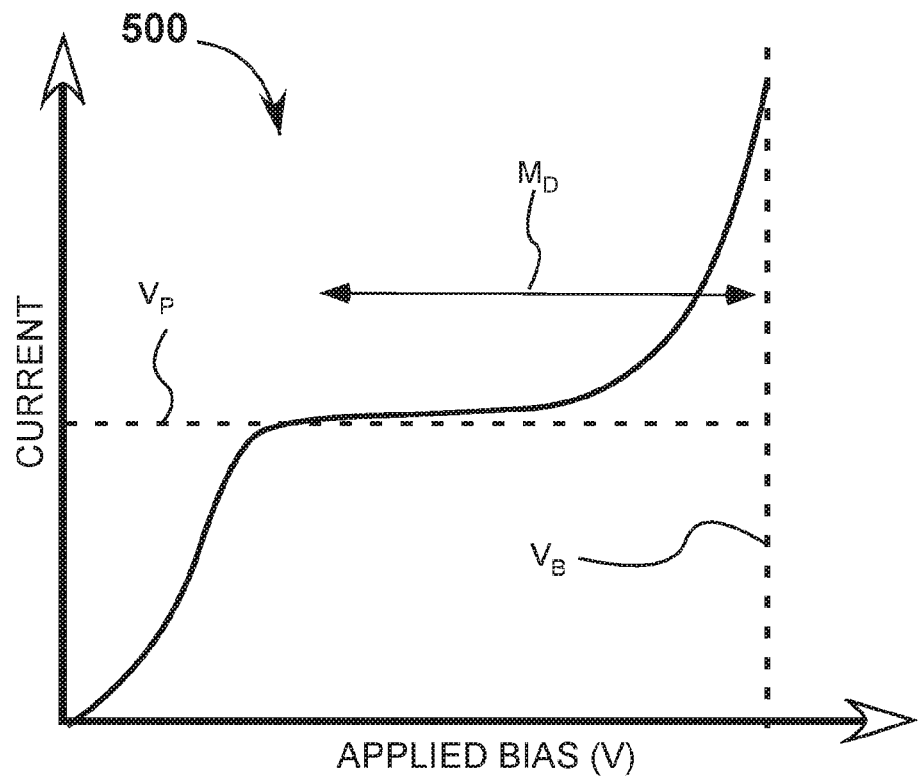
FIG. 8 shows current vs bias voltage for the APD.
Figure 9:
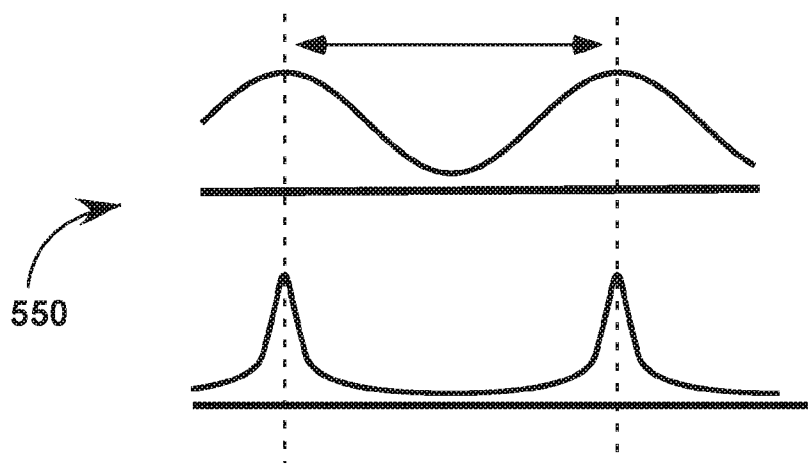
FIG. 9 shows a graphical view of a modulated bias that is sinusoidal and resulting gain provided to the APD.

Referring to FIG. 8 and FIG. 9, an I-V curve 500 and a graph 550 explain bias and gain relation for APD bias modulation. I-V curve 500 illustrates a typical APD performance in accord with the present disclosure. Under typical operating conditions the APD bias modulation voltage depth $M_D$ is between a punch-through voltage $V_P$ and up to the break down voltage $V_B$. The modulation peak voltage can temporarily above the breakdown voltage. Graph 500 illustrates the difference in APD bias voltage and gain profile. A bias voltage profile 552 is sinusoidal. A corresponding gain profile 554 is hyper-Gaussian, due to the nonlinear relationship of applied bias and current as shown in FIG. 8.

A variety of techniques can be used in conjunction with the disclosed methods. In some methods, and as shown in the illustrative example, the APD bias frequency and optical signal frequency are matched. In other methods, the APD bias frequency is held at a higher frequency than the optical signal frequency. The APD bias waveform can include more that one frequency component. The waveform can be any arbitrary shape, including both analog and digital components superimposed. The external circuitry can include a correlation circuit that determines the optical signal frequency and can change the APD bias frequency, phase, and waveform. The APD bias modulation phase can be altered to increase the correlation of the electric signal and the optical signal. A matched filter can be used.

The terms and expressions that have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims that follow.

What is claimed is:

1. A method of detecting an optical signal, comprising the steps of
   providing an avalanche photodiode (APD) comprising a detection region, capable of detecting an optical signal and converting it to an electronic signal, a multiplication region capable of amplifying an electric current, said multiplication region, in operation, having a first ionization rate for electrons and a second ionization rate for holes, wherein said first ionization rate is different in magnitude from said second ionization rate, and exposure to the optical signal causes an impulse response;
   exposing the APD to a modulating optical signal;
   providing an external circuit that induces an APD bias to the multiplication region;
   modulating the APD bias in a manner that is correlated with the optical signal; and
   providing a circuit for amplifying and processing an electric signal from the avalanche photodiode, and outputting an output electric signal.

2. The method of claim 1, wherein the APD bias frequency and the optical signal frequency are matched.

3. The method of claim 1, wherein the APD bias modulation frequency is at a higher rate than the optical signal frequency.

4. The method of claim 1, wherein the circuit's amplifier bandwidth is at a higher frequency than the bias modulation.

5. The method of claim 1, wherein the optical signal frequency is determined by changing the APD bias modulation frequency and using a correlation process in the circuit to process the electronic signal.

6. The method of claim 5, wherein the circuit includes a matched filter.

7. The method of claim 1, wherein the APD bias modulation phase is altered to increase the correlation of the electrical signal and the optical input signal.

8. The method of claim 1, wherein a pulse detection circuit is included in the circuit.

9. The method of claim 1, wherein the bias waveform is modulated at voltages no less than the avalanche photodiode's punch-through bias.

10. The method of claim 1, wherein the bias waveform is modulated to voltages both greater than and less than the avalanche photodiode's breakdown voltage.

11. The method of claim 1, wherein the bias modulation waveform is sinusoidal.

12. The method of claim 1, wherein the optical signal is a binary communications signal.

13. The method of claim 1, wherein the optical signal is modulated at a rate greater than 1 GHz.

14. The method of claim 1, wherein the bias is modulated at a rate greater than 1 GHz.

15. The method of claim 1, wherein the optical signal is amplitude-shift key (ASK) modulated.

16. The method of claim 1, wherein the optical signal is On-off key (OOK) modulated.

17. The method of claim 11, wherein the bias is modulated to reduce inter symbol interference.

18. The method of claim 1, wherein the bias modulated is varied to decrease the bit error rate (BER).

19. The method of claim 1, wherein the external circuit includes a clock/data recovery (CDR).

20. The method of claim 1, wherein the modulated bias waveform has more than one frequency component.

21. The method of claim 1, wherein the circuit includes a common mode reject circuit to reduce the effectives of capacitive current injection caused by the bias modulation.

* * * * *